United States Patent [19]

Kropp

[11] Patent Number: 5,606,136
[45] Date of Patent: Feb. 25, 1997

[54] ELECTRICAL LEAD CROSSOVER, SENSING CELL WITH ELECTRICAL LEAD CROSSOVER, AND METHOD FOR MAKING SAME

[75] Inventor: Harry C. Kropp, Barrington, Ill.

[73] Assignee: Breed Automotive Technology, Inc., Lakeland, Fla.

[21] Appl. No.: 419,374

[22] Filed: Apr. 10, 1995

[51] Int. Cl.[6] .................................................. G06K 9/00
[52] U.S. Cl. ................... 73/862.046; 73/862.045
[58] Field of Search ....................... 73/862.046, 862.045, 73/862.381, 862.68

[56] References Cited

U.S. PATENT DOCUMENTS

| | | | |
|---|---|---|---|
| 4,317,011 | 2/1982 | Mazurk | 200/5 |
| 4,492,949 | 1/1985 | Peterson et al. | 73/862.46 |
| 4,964,302 | 10/1990 | Grahn et al. | 73/862.46 |
| 5,400,662 | 3/1995 | Tamori | 73/862.46 |
| 5,403,980 | 4/1995 | Eckrich | 200/5 A |
| 5,503,029 | 4/1996 | Tamori | 73/862.46 |

*Primary Examiner*—Richard Chilcot
*Assistant Examiner*—Max H. Noori
*Attorney, Agent, or Firm*—Laff, Whitesel, Conte & Saret, Ltd.

[57] ABSTRACT

A thin film sensing cell having an internal electrical lead crossover to provide electrical connections to the sensing cell at the same surface. In one form, the sensing cell comprises a bottom backing sheet having upper and lower surfaces, a first conductive pattern having a first portion deposited on the upper surface of the bottom backing sheet, with a first opening extending through the sheet and through the first portion of the conductive pattern, and a second opening extending through the sheet at a location displaced outwardly of the first conductive pattern. A second conductive pattern having first and second spaced portions is deposited on a lower surface of a top backing sheet. The top and bottom backing sheets are aligned such that the first portions are in confronting relationship, and the first and second conductive portions are electrically accessible, respectively, through the first and second openings.

24 Claims, 5 Drawing Sheets

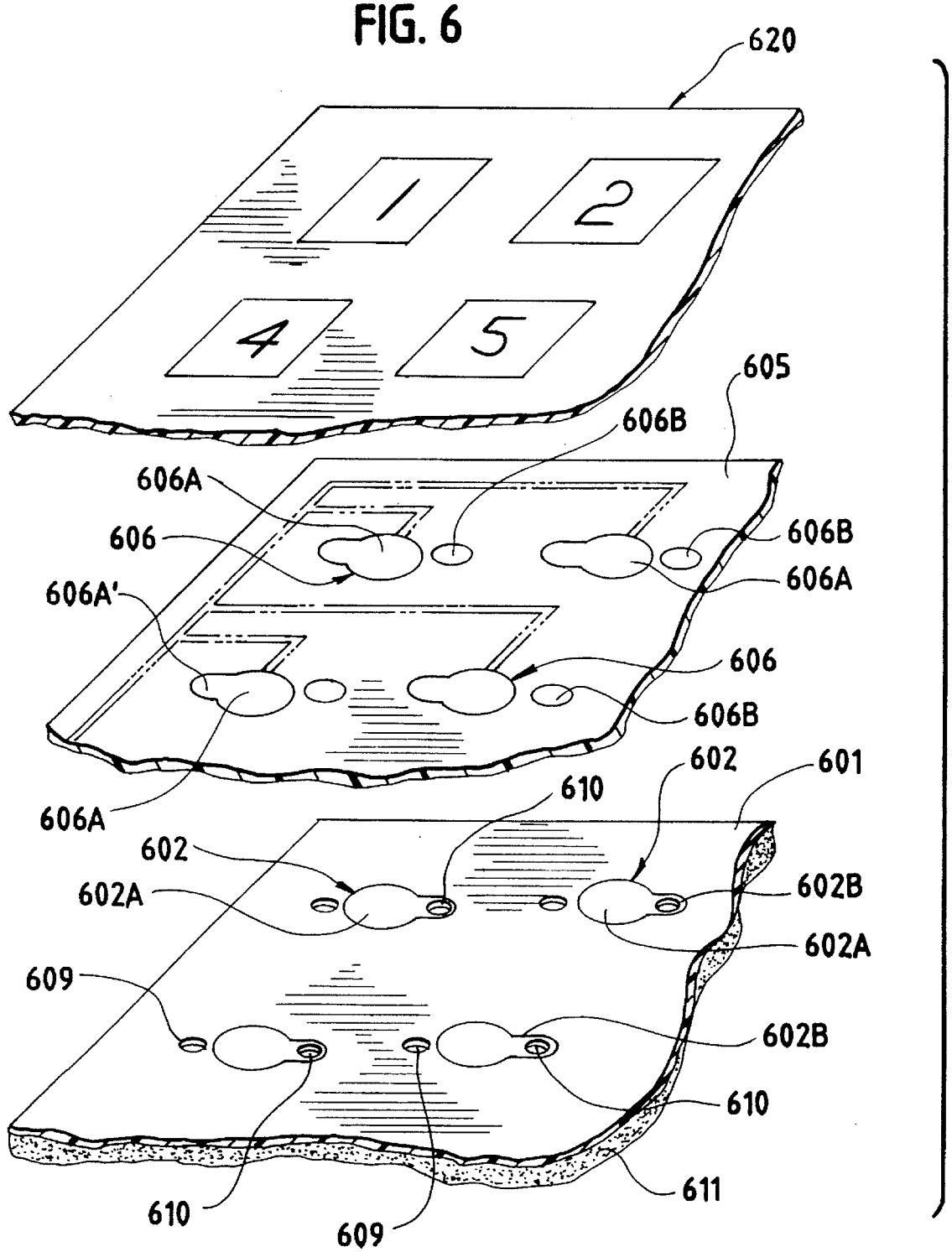

ELECTRICAL LEAD CROSSOVER, SENSING CELL WITH ELECTRICAL LEAD CROSSOVER, AND METHOD FOR MAKING SAME

FIELD OF THE INVENTION

This invention relates generally to an electrical circuit assembly such as a sensing cell designed to detect application of a force and in particular to such a sensing cell fabricated with conductive portions on confronting backing layers. More particularly, the invention is directed toward an internal electrical lead crossover or jumper to provide external electrical connections for the assembly at the same surface.

BACKGROUND OF THE INVENTION

Thin film sensing cells are generally known, and provide the capability to detect, by means of an electrical signal, the application of a force to the cell. It is common practice to construct such sensing cells by depositing conductive patterns on thin, transparent, plastic backing sheets, such as polyester sheets, then folding the backing sheets over or otherwise juxtaposing the backing sheets to bring the conductive patterns into a desired confronting array. An electrical lead extends from each conductive pattern, and is customarily provided on the same sheet and surface as the portion of the conductive pattern with which it is associated. Thus, the electrical lead from the upper conductive pattern, for example, appears on the top backing sheet, while the electrical lead for the bottom conductive pattern appears on the bottom backing sheet.

Such an electrical lead configuration requires special arrangements to provide an electrical interface from the sensing cell to an associated circuit, such as, for example, a printed circuit board. Because the electrical leads typically appear on facing surfaces of the two different backing sheets, connectors must be used to capture the portions of the backing sheets on which the electrical leads from the conductive patterns are deposited, making connection to circuits difficult.

Accordingly, a need arises for an electrical termination technique that does not require special connectors, and does not require a connection format that must access both sides of the cell or other electrical circuit assembly in which such connection techniques are required.

SUMMARY OF THE INVENTION

In accordance with the present invention, an electrical circuit assembly such as a sensing cell with an improved electrical lead crossover is provided. The cell comprises a bottom backing sheet having upper and lower surfaces, a first conductive pattern having a first portion deposited on the upper surface of the bottom backing sheet, with a first opening extending through the sheet and through a first portion of the conductive pattern, and a second opening extending through the sheet at a location displaced outwardly of the first conductive pattern, and a second conductive pattern having first and second spaced portions deposited on a lower surface of a top backing sheet. The top and bottom backing sheets are aligned such that the first portions are in confronting relationship, and the first and second conductive portions are electrically accessible, respectively, through the first and second openings.

In one form, a pressure sensitive resistive material is interposed between the first and second conductive patterns to control electrical conductivity between the first and second conductive patterns. In another form, the interposed material is an electrically insulating material.

Preferably, an adhesive material is interposed between the top and bottom backing sheets to maintain the top and bottom backing sheets in a fixed confronting relationship. In a preferred form, a conductive adhesive layer is applied to the lower surface of the bottom backing sheet, such that when the top and bottom backing sheets are brought into confronting relationship, the conductive adhesive provides electrical contact with the first conductive pattern first portion through the first opening, and with the second conductive pattern second portion through the second opening. The conductive adhesive may be an anisotropic electrically conductive adhesive (sometimes referred to as a z-axis adhesive) and the first and second conductive patterns preferably define confronting electrode portions. The cell is adapted to be secured to a pair of conductors on a printed circuit board.

The invention also contemplates a matrix of sensing cells or other electrical circuit assemblies matrix comprising an arrayed plurality of first conductive patterns having first and second portions deposited on an upper surface of a bottom backing sheet, with a plurality of first openings extending through that sheet and a first opening extending through a first portion of an associated conductive pattern, and a plurality of second openings extending through the sheet and a second opening being proximate to each first pattern, but displaced outwardly of each first pattern, and an arrayed plurality of second conductive patterns disposed in an arrangement similar to the arrayed plurality of first conductive patterns, each second pattern having a first and a spaced second portion deposited on a lower surface of a top backing sheet. The top and bottom backing sheets are aligned such that each pattern of the arrayed plurality of first conductive patterns is in a confronting relationship with a corresponding pattern of the arrayed plurality of second conductive patterns, and each first portion of a pair of corresponding first and second conductive patterns is electrically accessible through an associated first opening and each second portion of a second conductive pattern is electrically accessible through an associated second opening.

In one form, a plurality of conductive patterns on one of the backing sheets are electrically connected to each other. Preferably, a pressure sensitive resistive material is interposed between the first and second conductive patterns to control electrical conductivity between the first and second conductive patterns. Desirably, a conductive adhesive layer is applied to the lower surface of the bottom backing sheet, such that, when the top and bottom backing sheets are brought into confronting relationship, the conductive adhesive provides electrical contact with each first portion of a pair of corresponding first and second conductive patterns through an associated first opening, and the conductive adhesive provides electrical contact with each second portion of a second conductive pattern through an associated second opening.

The present invention also contemplates a method for providing electrical terminations on a single side of an electrical circuit assembly such as a sensing cell. The method comprises the steps of providing a bottom backing sheet having upper and lower surfaces depositing a first conductive pattern having first and second portions on the upper surface of the bottom backing sheet, with a first opening extending through the sheet and through the first portion of the conductive pattern, and a second opening extending through the sheet at a location displaced outwardly of said conductive pattern, depositing a second conductive pattern having first and second spaced portions on a lower surface of a top backing sheet, and aligning the top and bottom backing sheets such that the first conductive portions are in confronting and conducting relationship, so that the first conductive portions are electrically accessible through the first opening and the second conductive pattern second portion is electrically accessible through the second opening.

Further objects, features and advantages of the present invention will become apparent from the following description and drawings.

BRIEF DESCRIPTION OF THE DRAWINGS

FIG. 6 is an exploded perspective view of arrayed sensors of the present invention as embodied in a keypad format;

DETAILED DESCRIPTION

The sensors employing the electric circuit assemblies of this invention are thin film pressure sensitive resistive force sensors with integral electrical lead crossovers that provide electrical connections at one surface to both electrodes of a two-electrode sensor.

As is common practice in the design of thin film sensors, sensors of the present invention are formed with opposing thin, transparent polyester backing sheets. The opposing sheets are folded over or otherwise juxtaposed to achieve the desired alignment, thus forming a completed sensor.

Figure 1:
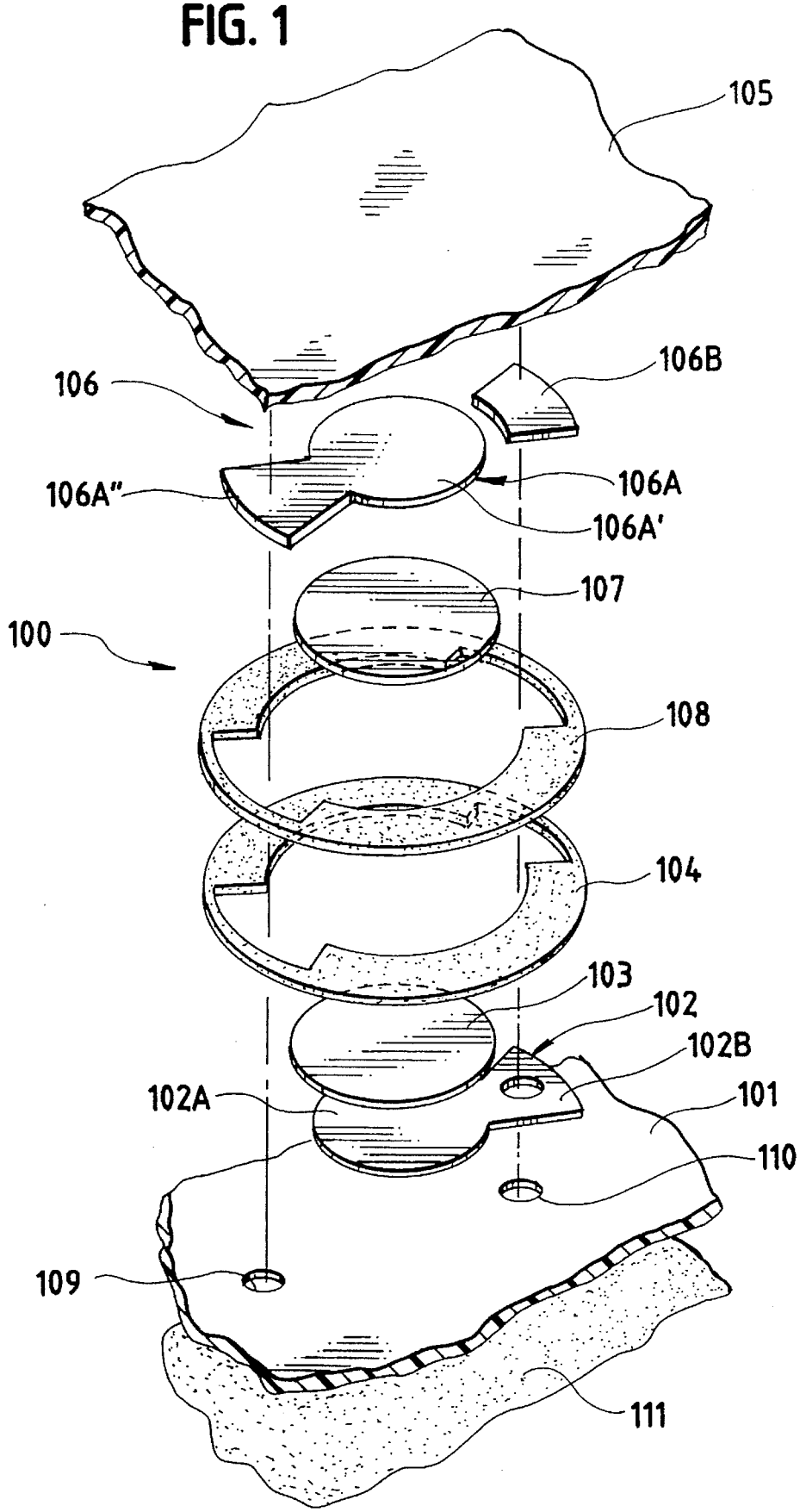
FIG. 1 is an exploded perspective view of a sensor of the present invention.

FIG. 1 is an exploded perspective view of a sensing cell such as sensor 100 of the present invention. As can be seen there and in FIGS. 2–4, sensor 100 includes a conductive electrode pattern 102 deposited on a bottom plastic backing sheet 101. The conductive pattern 102 comprises a circular electrode portion 102A and an extension which provides a conductive lead. In the embodiment of FIG. 1, the conductive pattern is of a keyhole shape and the extension is a trapezoidal portion 102B. Both of these portions are parts of the same continuous conductive pattern 102. Preferably, the conductive pattern 102 is deposited by a printing process, such as a silk-screening process, using conductive ink in a known manner.

After the conductive pattern 102 is deposited, a known pressure sensitive resistive ink 103, such as one containing molybdenum disulfide, is deposited in a slightly larger circular pattern directly on top of the circular portion 102A of the conductive pattern 102, without overlying the majority of the trapezoidal extension 102B.

After the pressure sensitive resistive ink 103 is deposited, a layer of adhesive 104, such as a conventional pressure sensitive adhesive, is deposited in such a way that the adhesive surrounds the pressure sensitive resistive ink layer 103, and the conductive pattern 102, without coming into direct contact with either.

Although the other layers to be described may be formed sequentially or simultaneously, in the preferred process of manufacture, at the same time the above-described steps are being carried out, corresponding layers are being deposited on a top plastic sheet 105. A conductive pattern or layer 106 of two separate parts is deposited on this top plastic backing sheet 105. The first part 106A is a conductive portion, such as of a keyhole-shaped pattern of similar design to counterpart conductive pattern 102 on the bottom plastic sheet 101. Part 106A includes a circular electrode portion 106A' and an extension 106A" of a trapezoidal configuration. The second part 106B is a separate, spaced conductive portion, as of a shape complementary to the extension 102, that does not come into contact with the keyhole-shaped portion 106A. The reasons for this construction of the upper conductive layer 106 will be discussed in detail subsequently.

After the deposition of the conductive layer 106, a slightly oversized circular layer 107 of pressure sensitive resistive material is deposited such that it overlies the circular portion 106A' of the keyhole-shaped portion 106A, but does not overlie the majority of the extension 106A" or any portion of part 106B.

When the pressure sensitive resistive material 107 deposition process is complete, pressure-sensitive adhesive 108 is applied in such a way that the adhesive 108 does not overlie any part of the electrode portion 106A' or the pressure sensitive resistive material 107. In fact, as can be seen in FIG. 1, both adhesive layers 104, 108 are formed in such a way that they surround both the trapezoidal and circular portions of the conductive patterns 102, 106, without overlying any part of these conductive patterns.

As mentioned above, in actual practice similar layers are deposited at the same time. In other words, the bottom backing sheet 101 and the top backing sheet 105 may be part of the same sheet of material until they are folded over to form the finished sensing cell. This structure simplifies manufacturing and assures proper alignment, since both bottom and top conductive patterns 102, 106 can be deposited at the same time, as can bottom and top pressure sensitive resistive material layers 103, 107, and adhesive layers 104, 108.

After the layer deposition steps have been completed (and before juxtapositioning of the two sheets), two openings or holes 109, 110 are punched through the bottom backing sheet 101. These holes are located to be positioned in alignment with extension 106A", on the one hand, and with portion 102B, on the other hand. Hole 110 is of a size smaller than extension 102B and may be surrounded thereby. As such, when patterns 102, 106 are juxtaposed, hole 110 will expose a portion of part 106B and hole 109 will expose extension 106A". Then, conductive adhesive 111 is disposed over each hole 109, 110 so that the confronting electrode portions 106A" and 106B can be directly adhered to leads, such as those on a circuit board, to effect proper contact. The adhesive may be separate bodies or may be a single body 111. If the adhesive is deposited as a single body, in order to isolate the two contacts from each other, a layer of special adhesive 111 that conducts in a direction normal to its plane, but not within its plane, is applied to the bottom surface of the bottom backing sheet 101. This adhesive is termed a "z-axis" conductive adhesive, since the z-axis is, by convention, the axis perpendicular to its plane. Such an adhesive is available from 3M Industrial Specialties Div., 3M Center Bldg., St. Paul, Minn., as Scotch Brand 9703 Conductive Adhesive Transfer Tape.

Figure 2:
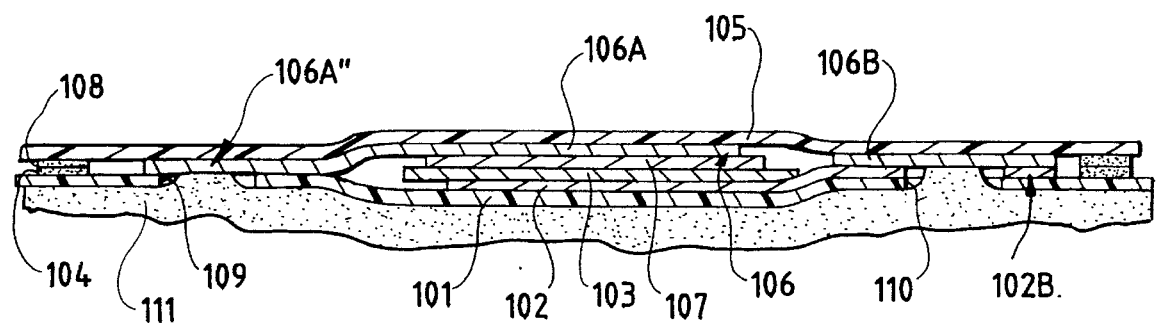
FIG. 2 is a cross-sectional view of the sensor of FIG. 1, taken substantially along line 2—2 of FIG. 3.
Figure 3:
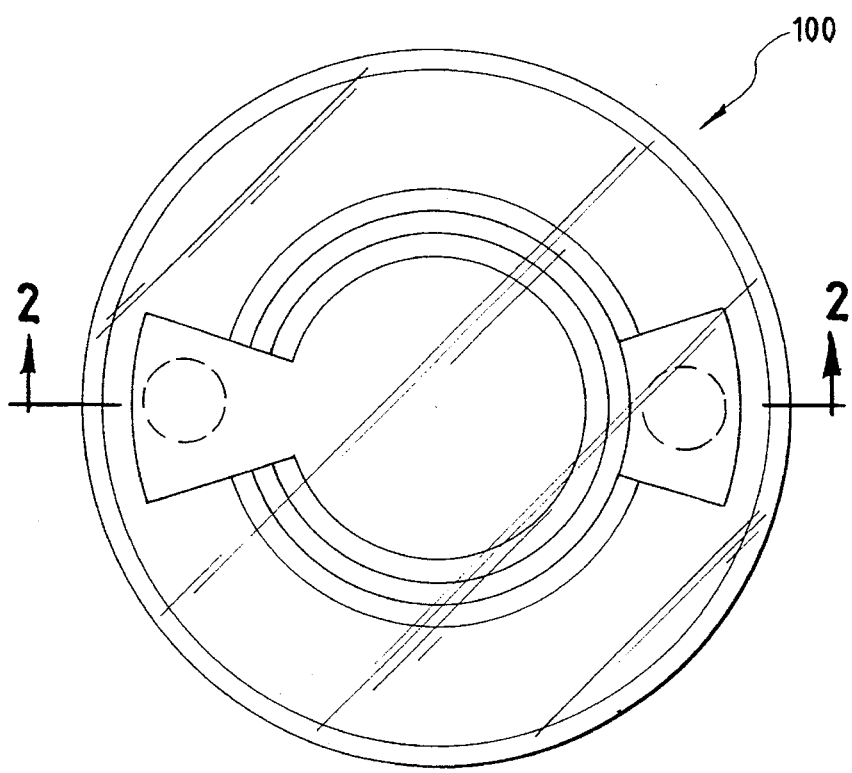
FIG. 3 is a plan view of the assembled sensor of FIG. 1.

The sectional view of FIG. 2 serves more clearly to illustrate the purposes for the holes 109, 110 in the bottom backing sheet 101. As can be seen in FIG. 2, hole 110 penetrates both the bottom backing sheet 101 and the conductive layer 102, penetrating the conductive layer 102 in the trapezoidal lead portion 102B. Because it is outside of the conductive pattern 102, hole 109 penetrates only the backing sheet 101.

When the sensor is assembled (when the top and bottom backing sheets are juxtaposed in proper alignment with one another), the conductive adhesive layer 111 makes contact with the upper trapezoidal conductive portion 106B, pulling this conductive portion 106B into firm electrical contact with the lower conductive pattern portion 102B. Thus, electrical contact with the bottom conductive pattern 102 is made via portion 106B through hole 110. In a similar fashion, the conductive adhesive 111 makes contact with the extension 106A" of the upper conductive layer 106A through hole 109. Thus, good electrical contact is available to the top conductive pattern 106 through the hole 109. In this way, electrical contact can be made with both upper and lower conductive patterns through a single surface of the finished sensor, and an electrical lead crossover has thus been accomplished.

Since the special adhesive 111 is conductive only in the z direction, a continuous adhesive can mate directly with separate electrical contact pads, such as those found on a printed circuit board, to effect proper contact with the sensor while maintaining electrical isolation for each contact. Alternatively, separate conductive adhesive bodies which may conduct in x, y and z directions may be used.

Figure 4:
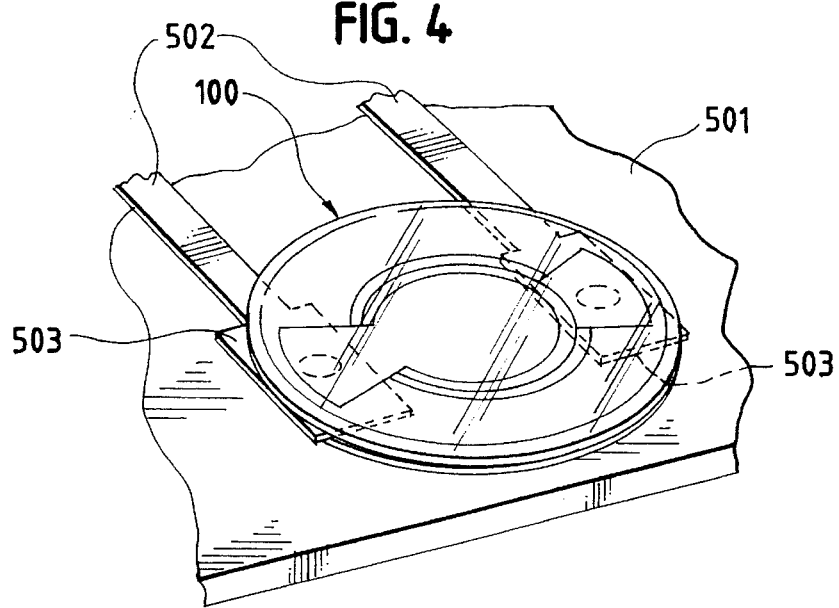
FIG. 4 is a perspective view of the assembled sensor of FIG. 3 secured to a printed circuit board.

FIG. 4 illustrates sensing cell 100 affixed to a printed circuit board 501. The printed circuit board 501 includes electrical conductors 502 with electrical contact pads 503 that make electrical contact with the sensing cell 100, as via the conductive adhesive layer 111.

The sensing cell 100 may also be utilized without a conductive adhesive material 111. In such an application, the sensing cell 100 can be configured such that the conductive pattern portion 106A" and the confronting conductive pattern portions 106B and 102B that provide the crossover of this invention, are brought into direct contact with one another as appropriate, and with corresponding external electrical terminals, when a force is applied to the sensing cell. In this embodiment, the electrical contact pads 503 of the printed circuit board 501 may have raised areas sufficient to engage the conductive positions through the openings 109, 110 in the bottom backing sheet 101 of the sensing cell 100.

Figure 5:
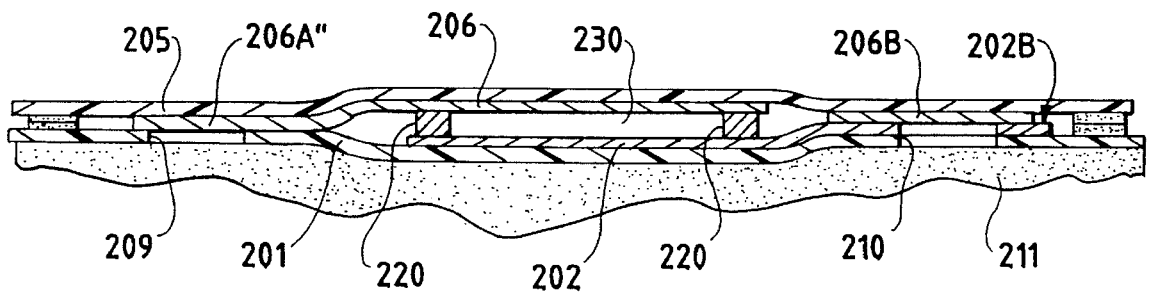
FIG. 5 is a sectional view like FIG. 2, but illustrating a sensor having an interposed insulating material spacing the conductive patterns.

The material interposed between the conductive patterns need not be a pressure sensitive resistive material. If a low resistance electrical contact were desired when a force is applied to the sensing cell, an electrically insulating material could be interposed between the conductive patterns. FIG. 5 shows an insulating material 220 interposed between conductive patterns 202, 206. Of course, the insulating material has appropriate opening means in the region 230 directly between the confronting conductive patterns 202, 206, such that the confronting patterns can make direct contact in response to an applied force. The insulating material must also be absent in the regions near the openings 209, 210, so that the insulating material does not interfere with the proper internal electrical connections described above, namely with the conductive pattern portions 206A", on the one hand, and 206B and 202B, on the other hand.

Of course, the sensor design described is not limited to a single sensor arrangement. A plurality of sensors can be fabricated side by side on a backing sheet in any arrangement desired. One advantageous arrangement is a rectangular array of sensors suitable as a keypad. In such a keypad arrangement, the conductive patterns of the top backing sheet may be arranged as rows of conductive patterns, while the conductive patterns of the bottom backing sheet may be arranged as columns of conductive patterns. Such a row and column connection is desirable when connecting a keypad to external circuitry.

FIG. 6 illustrates the manner in which multiple sensing cells as described above can be arranged in an array to function as a keypad, for example. Of course, the specific arrangement of the sensing cells may be dictated by the application, and, consequently, the cells may be disposed in other regular or irregular arrays. In FIG. 6, an arrayed plurality or matrix of sensing cells is depicted. For clarity of illustration, only the bottom and top backing sheets 601, 605, the respective, deposited conductive patterns 602, 606, and an illustrative top layer 620 used for printing a legend are shown. Since an appropriate legend may be printed on the upper surface of the top backing sheet 605, if desired, the top layer 620 may be dispensed with.

Construction of each sensing cell is similar in every detail to the individual sensing cells 100 described above, and includes, inter alia, pressure sensitive resistive layers, like layers 103, 107, which cover the electrode portions of the conductive patterns. The conductive patterns 602 deposited on the bottom backing sheet 601 each include a first portion 602B through which an opening 610 extends. A second opening 609 appears proximate to each conductive pattern 602, but displaced outwardly from each such pattern.

The conductive patterns 606 deposited on a lower surface of the top backing sheet 605 have first and second spaced portions, 606B, 606A, respectively. When assembled into a complete sensing cell matrix, each conductive pattern 606B and 606A is electrically accessible, respectively, through the openings 610, 609 in the bottom backing sheet 601.

Conductive adhesive 611 is applied to the lower surface of the bottom backing sheet 601. This conductive adhesive 611 pulls the first portion 606B of the upper conductive pattern 606 into electrical contact with the first portion 602B of the lower conductive pattern 602, thus making the lower conductive portion 602B electrically accessible through this first opening 610. The conductive adhesive also contacts the second portion 606A" of the upper conductive pattern 606, thus making the upper conductive pattern electrically accessible through the second opening 609.

The completed sensing cell array is then affixed to a printed circuit board (not shown), as in the manner described regarding FIG. 4. Since the conductive adhesive applied to the lower surface of the bottom backing sheet 601 is a z-axis conductive adhesive, as described previously, selective electrical contact is made between electrical contact pads on the printed circuit board and the openings 609, 610 in the bottom backing sheet 601. Thus, each individual sensing cell of the matrix can be electrically accessed.

Of course, there are other types of electrical connection schemes that can be employed in interconnecting with the sensing cell matrix. If reduction of the total numbers of electrical connections between the sensing cell matrix and its associated printed circuit board were to become necessary, some or all of the top conductive patterns could be connected to a common point, for example, leaving individual connections to the bottom conductive pads, or vice versa. Such an arrangement is illustrated in dotted line in FIG. 6. The use of such an arrangement would eliminate the need for all of the openings otherwise to be associated with those conductive patterns except for one such opening. Matrix arrangements, such as organizing the sensing cells into rows and columns having common leads, are well-known in the keypad art and can be used as well.

It is also not necessary that the sensing cells of the matrix be used in conjunction with a pressure sensitive resistive material, although this is preferred. In configurations where it is desired to discern presence or absence of direct electrical contact, rather than the amount of force applied to a sensing cell, an insulating spacer material may be interposed between the confronting conductive patterns.

The electrical lead crossover described with respect to a sensing cell may also be applied to general thin film applications where it is necessary to make electrical terminations available on the same surface. For example, with sensing cells of the prior art, the electrical lead crossover technique described herein can be used to bring both conductive leads to the same surface in conjunction with a stiffening or ridigifying strip, thus creating a termination suitable for a card-edge connector.

Figure 7A:
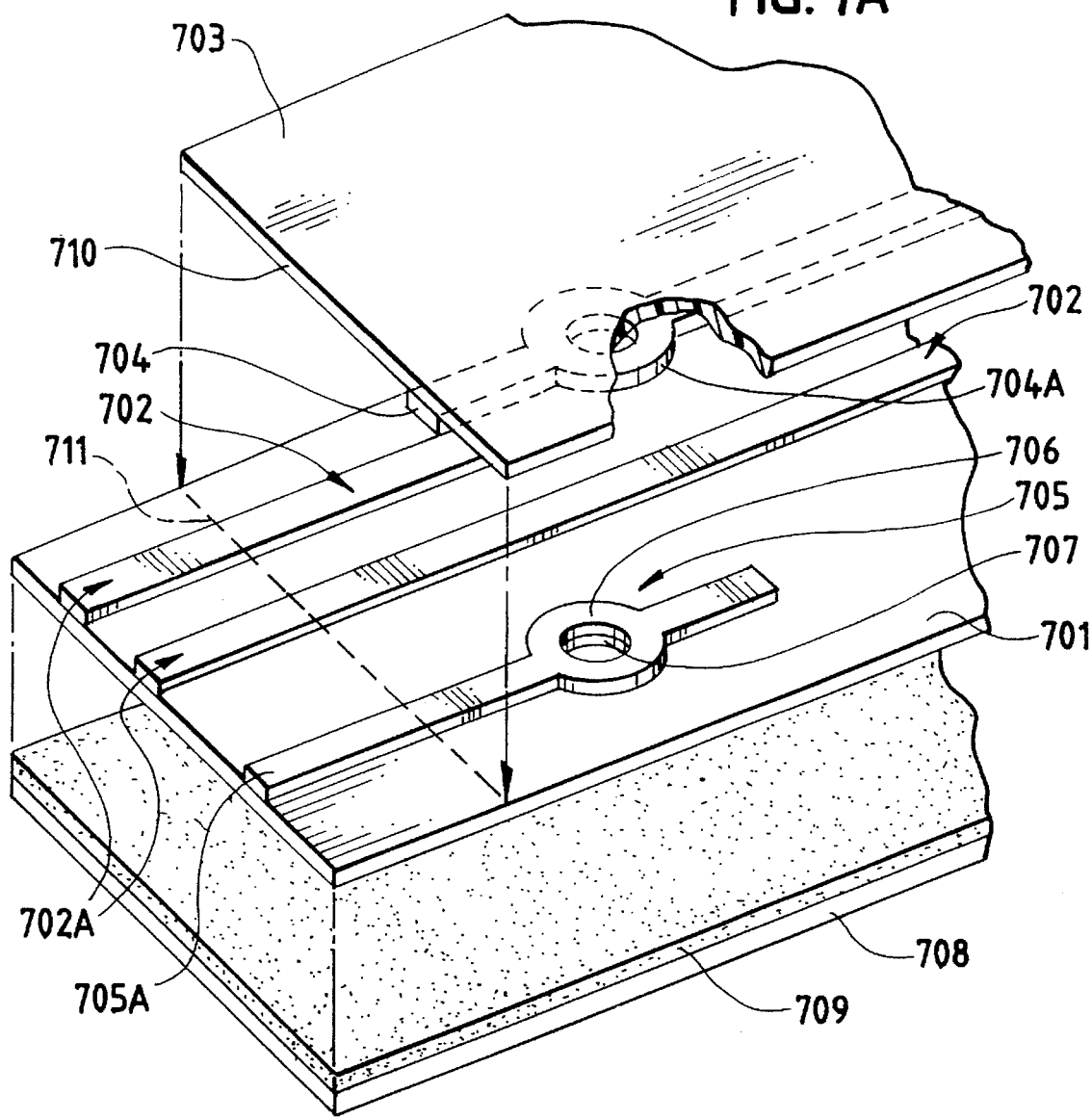
FIG. 7A is an exploded perspective view of a further electrical circuit assembly of the present invention.
Figure 7B:
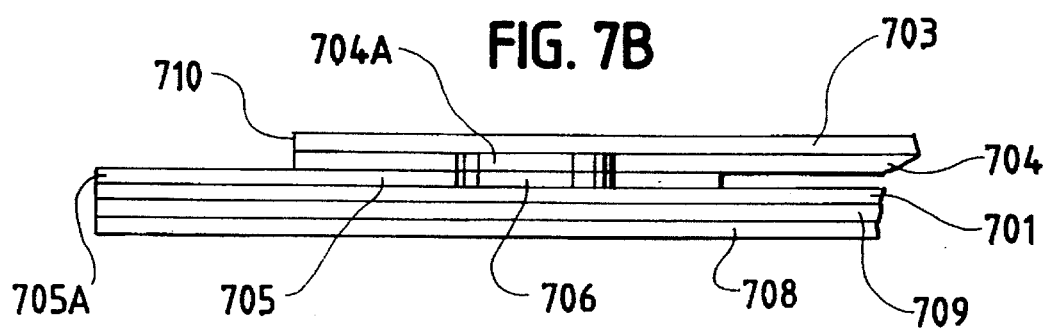
FIG. 7B is a side elevational view of the assembled circuit assembly of FIG. 7A.

FIGS. 7A and 7B illustrate the manner in which the electrical lead crossover of the present invention may be used to make electrical contact in a multiple layer electrical circuit assembly in which it is desired to provide all electrical connections on one surface of a single layer. As these figures show, a bottom backing sheet 701 has a number of conductive patterns 702 deposited thereon, such as from the electrodes of an associated circuit, such as a sensing cell circuit. Another conductive pattern 705 is used to serve as a jumper to effect a crossover. An opening 707 extends through the bottom backing sheet 701, and through a portion 706 of the conductive pattern 705.

A top backing sheet 703 has a conductive pattern 704 deposited on a lower surface 710. The conductive pattern 704 may extend from the associated circuit, such as from an electrode of a sensing cell. To achieve the electrical lead crossover, the top and bottom backing sheets 703, 701 are aligned such that the second pattern 704 and the first pattern 705, 706 are in confronting relationship, whereby the second conductive pattern 704 is electrically accessible via pattern 705.

To avoid obstructing the connection area 702A, 705A of the conductive patterns, the leading edge 710 of the top backing sheet 703 is recessed from the edge of the bottom backing sheet (as shown by dashed line 711). To complete the assembly, a plastic stiffener or stiffening sheet 708, having an adhesive 709 on an upper surface, is brought into contact with the bottom backing sheet 701. Sheet 708 could be, for example, a ten mil polyester sheet. The adhesive then makes contact with the second conductive pattern 704, through hole 707, pulling pattern 704 down into firm electrical contact with the portion 706 of the first conductive pattern 705. In this manner, an effective crossover mechanism for a multi-layer electrical circuit is provided.

Conductive pattern 704 may also employ an enlarged conductor portion 704A similar in size to pattern portion 706. The portion 704A may define a central opening corresponding to the opening in pattern portion 706. In that circumstance, the adhesive which extends into opening 707 may bond to the backing sheet 703 to provide improved adhesion between the stiffener 708 and the assembled backing sheets and conductive patterns.

From the foregoing it will be apparent to those skilled in the art that modifications may be made without departing from the spirit and scope of the invention. The claims are intended to embrace all such modifications.

What is claimed is:

1. An electrical circuit assembly comprising:

a bottom backing sheet having upper and lower surfaces;

a first conductive pattern having a first portion deposited on the upper surface of said bottom backing sheet, with a first opening extending through said sheet and through said first portion of said conductive pattern, and a second opening extending through said sheet at a location displaced outwardly of said first conductive pattern;

a second conductive pattern having first and second spaced portions deposited on a lower surface of a top backing sheet; and said top and bottom backing sheets being aligned such that said first portions are in confronting relationship, and said first and second conductive portions are electrically accessible, respectively, through said first and second openings.

2. The electrical circuit assembly of claim 1, wherein a material is interposed between said first and second conductive patterns to control electrical conductivity between said first and second conductive patterns.

3. The electrical circuit assembly of claim 2, wherein said interposed material is a pressure sensitive resistive material.

4. The electrical circuit assembly of claim 2, wherein said interposed material is an electrically insulating material.

5. The assembly of claim 4, wherein said insulating material opening means positioned directly between said first and second conductive patterns.

6. The assembly of claim 1, further including an adhesive material interposed between said top and bottom backing sheets to maintain said top and bottom backing sheets in a fixed confronting relationship.

7. The assembly of claim 1, further including a conductive adhesive layer applied to the lower surface of the bottom backing sheet, such that, when the top and bottom backing sheets are brought into confronting relationship, said conductive adhesive provides electrical contact with said first conductive pattern first portion through said first opening, and with said second conductive pattern second portion through said second opening.

8. A sensing cell matrix comprising:

an arrayed plurality of first conductive patterns having first and second portions deposited on an upper surface of a bottom backing sheet, with a plurality of first openings extending through said sheet and a said first opening extending through a first portion of an associated conductive pattern, and a plurality of second openings extending through said sheet and a said second opening being proximate to each first pattern, but displaced outwardly of each said first pattern;

an arrayed plurality of second conductive patterns, disposed in an arrangement similar to said arrayed plurality of first conductive patterns, each said second pattern having a first and a spaced second portion deposited on a lower surface of a top backing sheet;

said top and bottom backing sheets being aligned such that each pattern of the arrayed plurality of first conductive patterns is in a confronting relationship with a corresponding pattern of the arrayed plurality of second conductive patterns, and each first portion of a pair of corresponding first and second conductive patterns being electrically accessible through an associated first opening and each said second portion of a said second conductive pattern being electrically accessible through an associated second opening.

9. The sensing cell matrix of claim 8, wherein a plurality of conductive patterns on one of said backing sheets are electrically connected to each other.

10. The sensing cell matrix of claim 8, wherein a pressure sensitive resistive material is interposed between said first and second conductive patterns to control electrical conductivity between said first and second conductive patterns.

11. The sensing cell matrix of claim 10, further including a conductive adhesive layer applied to the lower surface of the bottom backing sheet, such that, when said top and bottom backing sheets are brought into confronting relationship, said conductive adhesive provides electrical contact with each first portion of a pair of corresponding first and second conductive patterns through an associated first opening, and said conductive adhesive provides electrical contact with each said second portion of a said second conductive pattern through an associated second opening.

12. A sensing cell comprising:

a bottom backing sheet having upper and lower surfaces;

a first conductive pattern having first and second portions deposited on the upper surface of said bottom backing sheet, with a first opening extending through said sheet and through said first portion of said first conductive pattern, and a second opening extending through said sheet at a location displaced outwardly of said first conductive pattern;

a second conductive pattern having spaced separate first and second portions deposited on a lower surface of a top backing sheet; and a conductive adhesive layer applied to the lower surface of the bottom backing sheet, such that, when the conductive patterns of the top and bottom backing sheets are brought into confronting relationship, said conductive adhesive provides electrical contact with said first conductive pattern first portion through said first opening, and with said second conductive pattern second portion through said second opening.

13. The sensing cell of claim 12, wherein said first separate portion of said second conductive pattern makes electrical contact with said conductive adhesive layer and with said first conductive pattern first portion.

14. The sensing cell of claim 12, further including pressure sensitive resistive material interposed between said first conductive pattern and said second conductive pattern.

15. The sensing cell of claim 14, wherein application of a force in a direction normal to said first and second backing sheets in the zone of said conductive patterns is electrically discernible.

16. The sensing cell of claim 12, further including adhesive material interposed between said top and bottom backing sheets to maintain the top and bottom backing sheets in a fixed confronting relationship.

17. The sensing cell of claim 12, wherein said first and second conductive patterns define electrode portions that overlie each other.

18. The sensing cell of claim 12, wherein said conductive adhesive layer lies in a plane, has a relatively high conductivity in a direction normal to the plane, and has a relatively low conductivity in directions parallel to the plane.

19. The sensing cell of claim 12, wherein said conductive adhesive layer affixes the sensing cell to a pair of conductors on a printed circuit board.

20. The sensing cell of claim 19, wherein the printed circuit board includes electrical contact pads in substantial alignment with said first and second openings, such that the printed circuit board makes selective electrical contact with the first and second conductive patterns.

21. A method for providing electrical terminations on a single side of a sensing cell, the method comprising the steps of:

(a) providing a bottom backing sheet having upper and lower surfaces;

(b) depositing a first conductive pattern having first and second portions on the upper surface of the bottom backing sheet, with a first opening extending through said sheet and through said first portion of said conductive pattern, and a second opening extending through said sheet at a location displaced outwardly of said conductive pattern;

(c) depositing a second conductive pattern having first and second spaced portions on a lower surface of a top backing sheet; and (d) aligning said top and bottom backing sheets such that said first conductive portions are in confronting and conducting relationship, and said first conductive portions are electrically accessible through said first opening and said second conductive pattern second portion is electrically accessible through said second opening.

22. An electrical circuit assembly comprising:

a bottom backing sheet having upper and lower surfaces;

a first conductive pattern disposed on the upper surface of said bottom backing sheet, with an opening extending through said sheet and through a portion of said conductive pattern;

a second conductive jumper pattern disposed on a lower surface of a top backing sheet;

said top and bottom backing sheets being aligned such that said first and second patterns are in confronting relationship, and said second conductive pattern is electrically accessible through said opening; and adhesive extending into said opening and holding said conductive patterns in electrical contact.

23. The electrical circuit assembly of claim 22, further including third conductive patterns disposed on said bottom backing sheet, with said second and third patterns all having contact portions on the same one of the surfaces of said bottom backing sheet.

24. The electrical circuit assembly of claim 23 and wherein said circuit assembly includes a stiffening sheet.

* * * * *